United States Patent
Han et al.

(10) Patent No.: US 7,615,494 B2
(45) Date of Patent: Nov. 10, 2009

(54) METHOD FOR FABRICATING SEMICONDUCTOR DEVICE INCLUDING PLUG

(75) Inventors: Ky-Hyun Han, Ichon-shi (KR); Ki-Won Nam, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,688

(22) Filed: Dec. 28, 2006

(65) Prior Publication Data

US 2008/0064221 A1 Mar. 13, 2008

(30) Foreign Application Priority Data

Sep. 11, 2006 (KR) ........................ 10-2006-0087560

(51) Int. Cl.
*H01L 21/302* (2006.01)
(52) U.S. Cl. .................. 438/707; 438/719; 438/723
(58) Field of Classification Search ................ 438/692, 438/707, 710, 712, 714, 719, 720, 723, 724, 438/725
See application file for complete search history.

(56) References Cited

U.S. PATENT DOCUMENTS

| | | | |
|---|---|---|---|
| 4,936,950 A | 6/1990 | Doan et al. | |
| 6,239,022 B1 * | 5/2001 | Seo et al. | 438/629 |
| 6,258,691 B1 * | 7/2001 | Kim | 438/398 |
| 6,268,264 B1 * | 7/2001 | Tseng | 438/424 |
| 6,350,682 B1 * | 2/2002 | Liao | 438/638 |
| 6,579,809 B1 * | 6/2003 | Yang et al. | 438/734 |
| 6,596,640 B1 * | 7/2003 | Fishcer et al. | 438/692 |
| 6,635,185 B2 * | 10/2003 | Demmin et al. | 216/64 |
| 6,670,278 B2 * | 12/2003 | Li et al. | 438/710 |
| 6,719,808 B1 * | 4/2004 | Kim et al. | 438/710 |
| 2007/0015362 A1 * | 1/2007 | Yun et al. | 438/689 |

FOREIGN PATENT DOCUMENTS

| | | |
|---|---|---|
| CN | 1485887 | 3/2004 |
| JP | 07-335757 | 12/1995 |
| JP | 08-023092 | 1/1996 |
| KR | 1020000045358 A | 7/2000 |
| KR | 1020020086100 A | 11/2002 |

* cited by examiner

*Primary Examiner*—Kin-Chan Chen
(74) *Attorney, Agent, or Firm*—Townsend and Townsend and Crew LLP

(57) ABSTRACT

A method for fabricating a semiconductor device includes forming an insulation layer over a substrate, etching the insulation layer using a hard mask pattern to form a contact hole, filling the contact hole with a conductive layer, etching the conductive layer to form a plug in the contact hole, removing the remaining hard mask pattern to expose an upper portion of the plug and have the upper portion protrude above the insulation layer, and forming a metal line over the protruding plug and around the upper portion of the plug.

20 Claims, 5 Drawing Sheets

METHOD FOR FABRICATING SEMICONDUCTOR DEVICE INCLUDING PLUG

CROSS-REFERENCE TO RELATED APPLICATIONS

The present invention claims priority of Korean patent application number 10-2006-0087560, filed on Sep. 11, 2006, which is incorporated by reference in its entirety.

BACKGROUND OF THE INVENTION

The present invention relates to a method for fabricating a semiconductor device, and more particularly, to a method for fabricating a contact plug which increases contact area.

Plugs are formed to connect metal interconnection lines on different layers. The tungsten plug process has been commonly used to form the plugs.

In the tungsten plug process, a tungsten layer is formed inside contact holes to form tungsten plugs. Then, an etch back process using a dry etching method is performed to isolate the plugs from each other.

FIGS. 1A and 1B illustrate a typical method for fabricating a semiconductor device. As shown in FIG. 1A, an inter-layer insulation layer 12 is formed over a substrate 11. The inter-layer insulation layer 12 is etched using a hard mask pattern 13 to form a contact hole 14.

As shown in FIG. 1B, the hard mask pattern 13 is removed. A tungsten layer is formed over the entire surface until the contact hole 14 is filled. Then, an etch back process is performed to form a tungsten plug 15. A metal layer is formed over the tungsten plug 15 and then patterned to form a metal line 16.

As the semiconductor device becomes highly integrated, the depth of the contact hole 14 gets deeper and thus, the deep contact hole is formed. After the tungsten plug 15 is formed and etched, an over etch is also performed to achieve etch uniformity throughout the wafer.

The over etch may generate plug loss on the tungsten plug 15 just inside the contact hole 14. A reference letter L1 shows the plug loss. The plug loss L1 may be great in certain parts of the wafer.

FIG. 2 is a micrograph illustrating the plug loss observed when the conventional method is employed. A large amount of the plug loss is generated on the top surface of the tungsten plug. Since a metal layer including aluminum (Al), copper (Cu), or tungsten (W) is formed over the tungsten plug, a plug loss can cause the contact area between a metal line and the tungsten plug to be reduced. As a result, there is often a loss in current from the increased resistance. Furthermore, the top surface of the tungsten plug is lower than the surrounding surface of the inter-layer insulation layer. Accordingly, if particles and various pollutants of a subsequent process flow into the tungsten plug gap, the tungsten plug may not be connected to the metal line.

SUMMARY OF THE INVENTION

Embodiments of the present invention are directed towards a method for fabricating a semiconductor device capable of increasing the contact area between a plug and a metal line.

In accordance with an aspect of the present invention, there is provided a method for fabricating a semiconductor device, including: forming an insulation layer over a substrate; etching the insulation layer using a hard mask pattern to form a contact hole; filling the contact hole with a conductive layer; etching the conductive layer to form a plug in the contact hole; removing the remaining hard mask pattern to expose an upper portion of the plug and have the upper portion protrude above the insulation layer; and forming a metal line over the protruding plug and around the upper portion of the plug.

DESCRIPTION OF SPECIFIC EMBODIMENTS

Figure 1A:
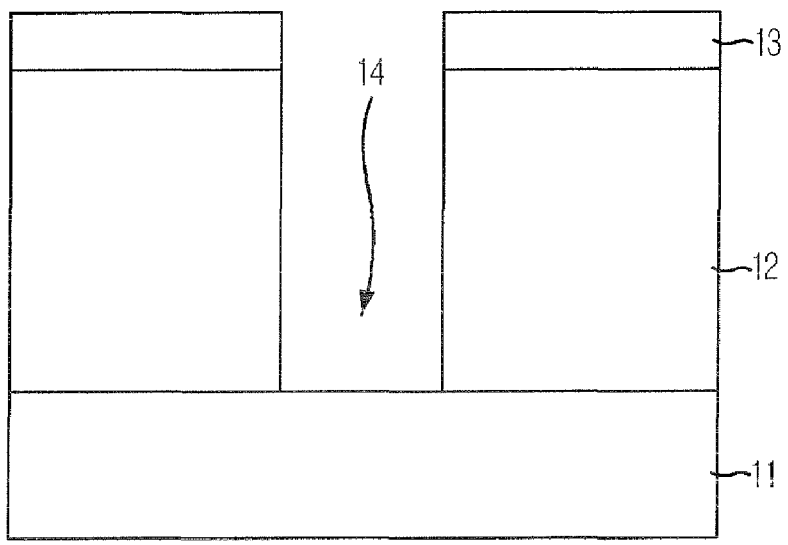
FIGS. 1A and 1B illustrate a typical method for fabricating a semiconductor device.
Figure 1B:
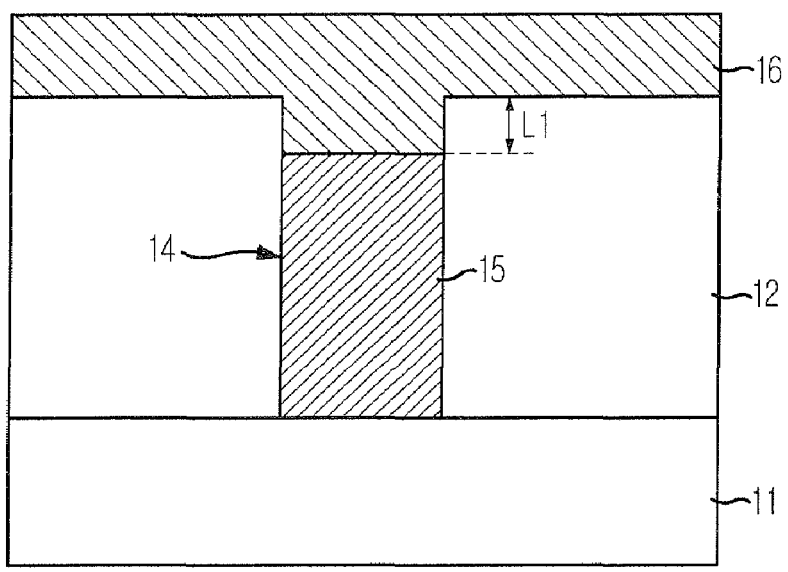
Figure 2:
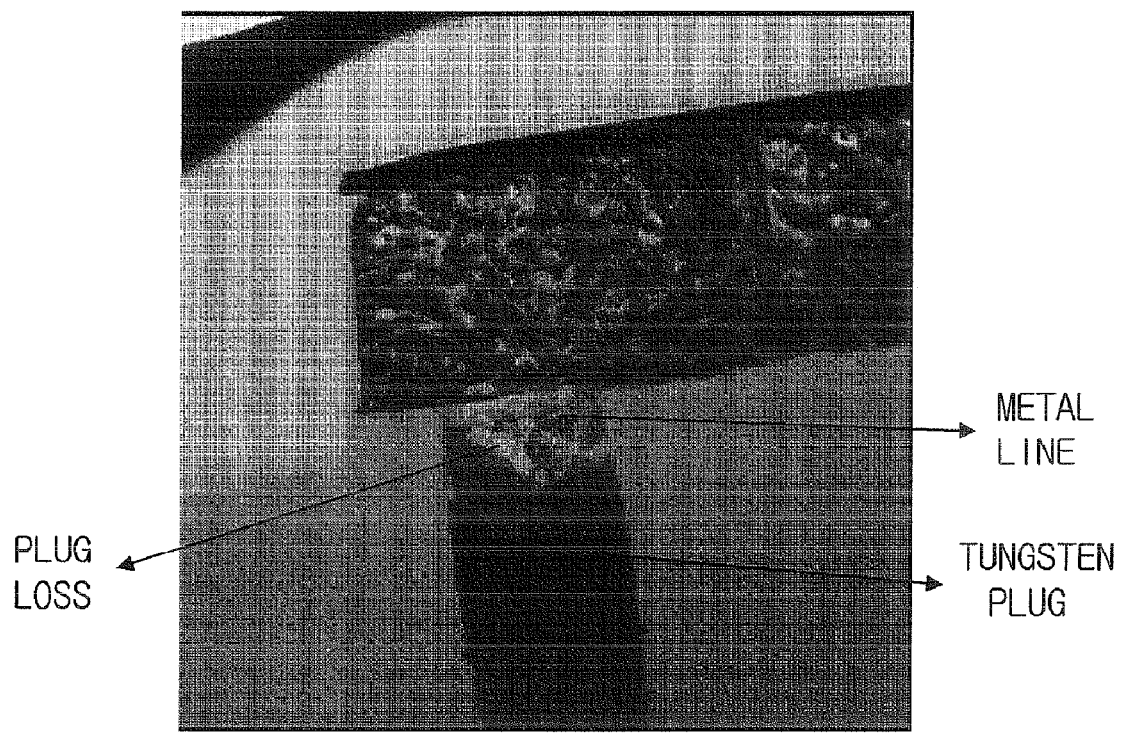
FIG. 2 is a micrograph illustrating a plug loss observed when the conventional method is employed.
Figure 3A:
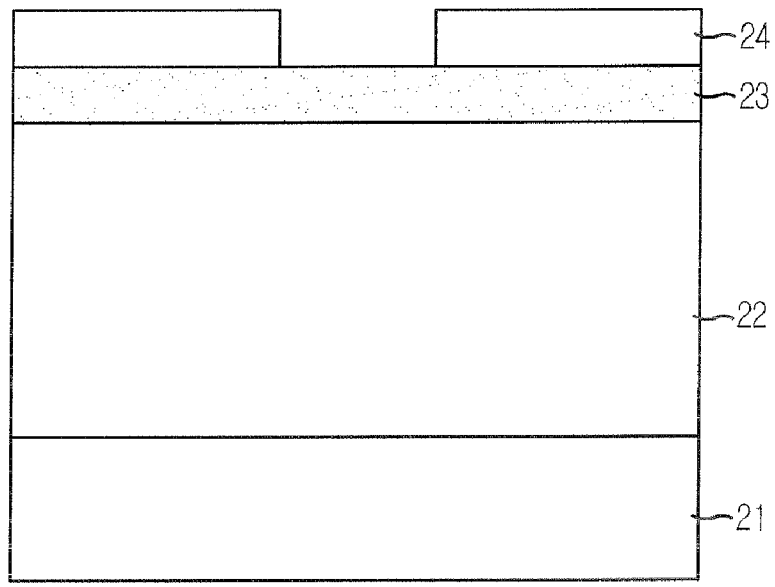
FIGS. 3A to 3F illustrate a method for fabricating a semiconductor device in accordance with an embodiment of the present invention.

FIGS. 3A to 3F illustrate a method for fabricating a semiconductor device in accordance with an embodiment of the present invention. As shown in FIG. 3A, an insulation layer 22 is formed over a substrate 21 where various elements are already formed. The substrate 21 can include an impurity junction region (i.e., a source/drain region) or a lower metal interconnection line. The insulation layer 22 includes an oxide-based material. Particularly, the insulation layer 22 includes a silicon oxide ($SiO_2$)-based layer such as a borophosphosilicate glass (BPSG) layer.

A hard mask layer 23 is formed over the insulation layer 22. The hard mask layer 23 is a sacrificial layer which provides a process margin lacking in the photoresist layer. In more detail, if a subsequent contact hole is formed for a metal interconnection line connected to a bit line, a depth of the contact hole is deep, i.e., to the depth of approximately 25,000 Å or greater. Accordingly, in case that the photoresist layer is used to form the contact hole, the photoresist layer is removed before the contact hole is formed since the photoresist layer does not have etch selectivity. As a result, the contact hole may not be formed properly.

The hard mask layer 23 is used to form the deep contact hole. The hard mask layer 23 includes one selected from a group consisting of polysilicon, a nitride layer containing a large amount of silicon, and a silicon nitride layer if the insulation layer 22 includes the oxide-based material. A photoresist layer is formed over the hard mask layer 23 and then patterned to form a contact mask 24.

Figure 3B:
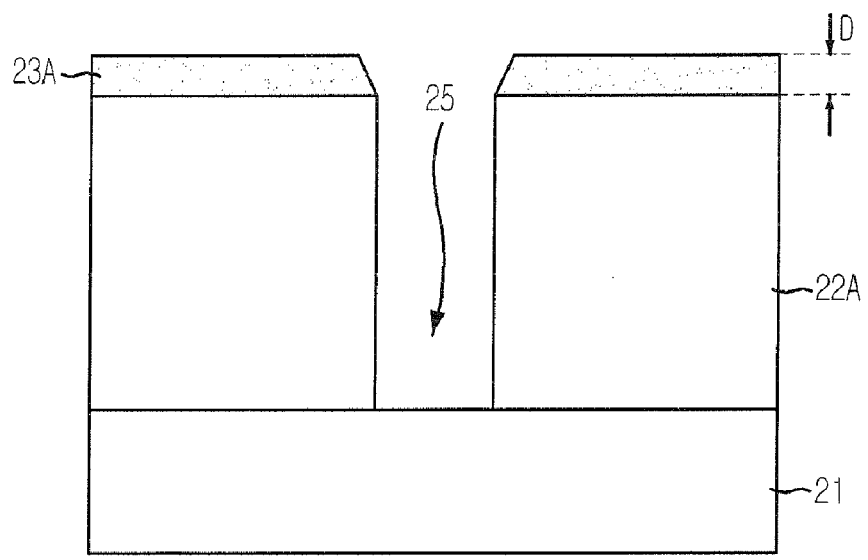

As shown in FIG. 3B, the hard mask layer 23 is etched using the contact mask 24 as an etch mask to form a hard mask pattern 23A. The shape of the hard mask pattern 23A resembles that of the contact mask 24.

A contact etching process is performed using the contact mask 24 and the hard mask pattern 23A as an etch barrier. The insulation layer 22 is etched to form a contact hole 25 exposing a surface of the substrate 21. The patterned insulation layer is denoted with a reference numeral 22A. The contact mask 24 can be removed before the contact hole 25 is completely etched to expose the substrate 21. However, the hard mask pattern 23A enables the formation of the contact hole 25 to continue until the substrate 21 is exposed. As used herein the term "substrate" refers to a layer or structure underlying the insulation layer 22. The substrate accordingly may be a silicon substrate or a metal layer, e.g., an interconnection line. If the substrate 21 is a metal layer, the contact hole 25 is referred to as a via hole.

After the contact hole 25 is formed, a certain thickness of the hard mask pattern 23A remains. According to the embodiment of the present invention, the remaining thickness D of the hard mask pattern 23A is approximately 200 Å or greater. Accordingly, when initially forming the hard mask layer 23, the initial thickness of the hard mask layer 23 is chosen by considering the remaining thickness D of the hard mask pattern 23A. Particularly, the remaining thickness D of the hard mask pattern 23A needs to be greater than the plug loss generated after an etch back process of a subsequent metal plug (e.g., tungsten plug). Thus, the thickness of the hard mask layer 23 initially formed is controlled to make the remaining thickness D of the hard mask pattern 23A range from approximately 200 Å to 500 Å in the present embodiment. If the remaining thickness D of the hard mask pattern 23A is greater than approximately 500 Å, a gap-filling defect can occur when forming the subsequent tungsten layer. Thus, the remaining thickness D of the hard mask pattern 23A needs to be less than approximately 500 Å in the present embodiment.

In the present embodiment, if the remaining thickness D of the hard mask pattern 23A is less than approximately 200 Å, the thickness of the plug loss generated on the tungsten plug may be greater. As a result, a thickness of the tungsten plug inside the contact hole 25 would be less.

Figure 3C:
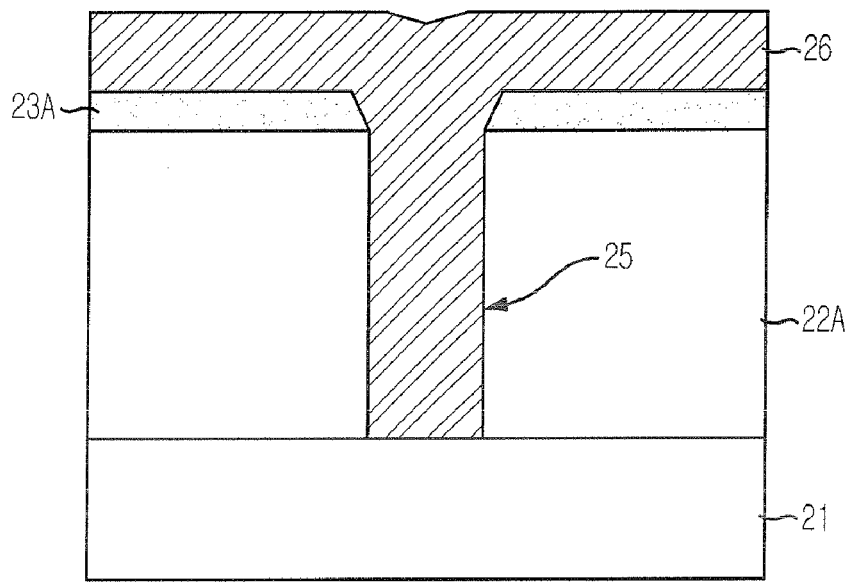

As shown in FIG. 3C, the tungsten layer 26 is formed over the patterned insulation layer 22A until the contact hole 25 is filled. Although not shown, a barrier metal can be formed before the tungsten layer 26 is formed. One type of well-known barrier metal is formed by sequentially stacking a Ti layer and a TiN layer through a physical vapor deposition (PVD) method. Accordingly, the barrier metal has a Ti/TiN structure. The tungsten layer 26 is formed by one of a chemical vapor deposition (CVD) method and a PVD method.

Figure 3D:
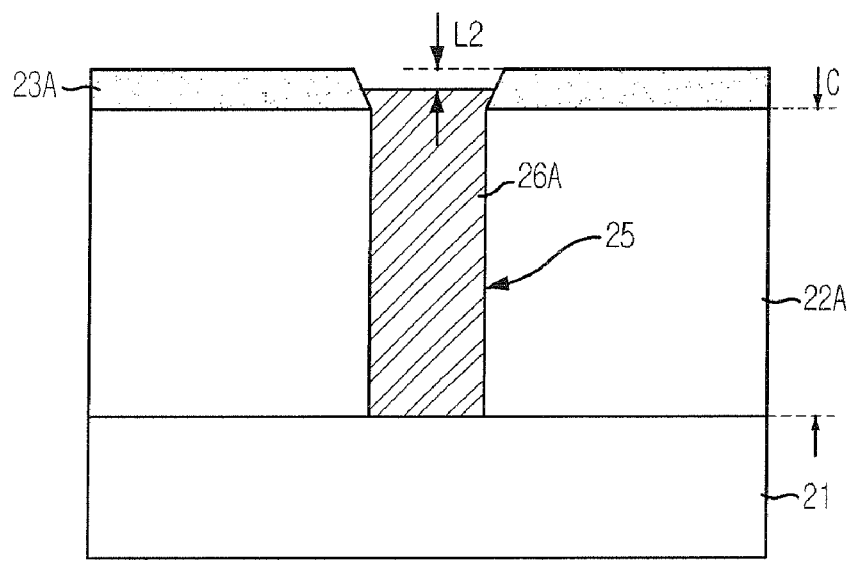

As shown in FIG. 3D, an etch back process is performed to the tungsten layer 26 to form a first tungsten plug 26A. The etch back process of the tungsten layer 26 includes sequentially performing a main etch to isolate the neighboring first tungsten plugs 26A from each other and an over etch to obtain etch uniformity. The over etch obtains the etch uniformity inside a wafer, and is performed to etch the tungsten layer 26 to a certain thickness approximately 30% more than the etch target thickness of the tungsten layer 26. For instance, the etch back process of the tungsten layer 26 is performed using plasma obtained from mixing sulfur hexafluoride ($SF_6$) and nitrogen ($N_2$) at an inductively coupled plasma (ICP) type plasma apparatus. The main etch and over etch are performed in situ.

As described above, the etch back process to form the first tungsten plug 26A includes performing the main etch and the over etch. As the over etch is performed during the etch back process, plug loss denoted with a reference letter L2 can be generated over the first tungsten plug 26A.

According to the embodiment of the present invention, the etch back process of the tungsten layer 26 is performed with the hard mask pattern 23A. Accordingly, the lower level of the plug loss L2 generated over the first tungsten plug 26A is at a higher level than the contact surface denoted with reference letter C. The contact surface C corresponds to an upper surface of the patterned insulating layer 22A.

Figure 3E:
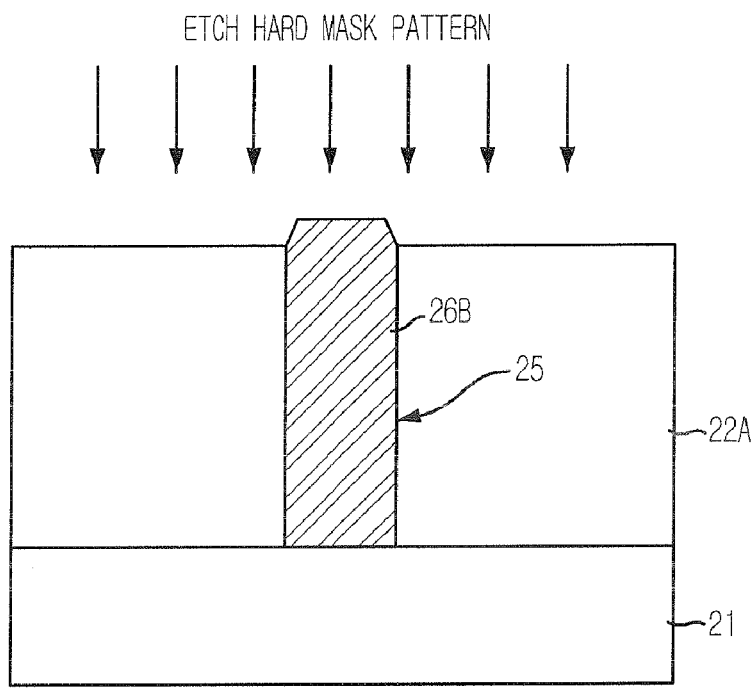

As shown in FIG. 3E, the hard mask pattern 23A is removed by an etching process. After the hard mask pattern 23A is removed, an upper portion of the first tungsten plug 26A protrudes above the contact surface C (or the patterned insulating layer 22A). Despite the plug loss of L2, the first tungsten plug 26A still protrudes above the contact surface C because the hard mask pattern 23A was provided with a thickness greater than L2. Hereinafter, a reference numeral 26B represents this protruding tungsten plug, and is referred to as a second tungsten plug 26B. The edges of the upper sidewalls of the second tungsten plug 26B are inclined. This pattern is because the edges of the second tungsten plug 26B are partially etched during the etching process to remove the hard mask pattern 23A. The edges of the upper sidewalls may vary according to implementations.

In the present embodiment, during the hard mask pattern 23A removal, etch selectivity between tungsten used to form the second tungsten plug 26B and the material used to form the hard mask pattern 23A is chosen to cause the top surface of the second tungsten plug 26B to protrude and the edges of the upper sidewalls of the second tungsten plug 26B to become inclined. In particular, the hard mask pattern 23A is etched approximately 2 to 3 times faster than tungsten.

An etching method used to remove the hard mask pattern 23A will be examined in detail hereinafter. If the hard mask pattern 23A includes a nitride-based material such as a nitride layer containing a large amount of silicon or a silicon nitride layer, the etching process is performed using a gas mixture of hexafluorobutadiene ($C_4F_6$), sulfur hexafluoride ($SF_6$) and chlorine ($Cl_2$) as an etch gas. The $C_4F_6$ gas mainly etches the nitride-based material, and the $SF_6$ gas mainly etches tungsten. The $Cl_2$ gas induces a chemical etch of tungsten.

A flow rate of the $C_4F_6$ gas ranges from approximately 20 sccm to approximately 80 sccm. A flow rate of the $SF_6$ gas ranges from approximately 10 sccm to approximately 20 sccm, and a flow rate of the $Cl_2$ gas ranges from approximately 50 sccm to approximately 150 sccm. If the etching process is performed using the gas mixture having the above mentioned flow rate, an etching rate of the hard mask pattern 23A including the nitride-based material is approximately 2 to 3 times faster than that of tungsten. As a result, the second tungsten plug 26B is provided with the protrusion-shape.

If the hard mask pattern 23A includes polysilicon, the etching process is performed using a gas mixture of hydrogen bromide (HBr) and $Cl_2$ as an etch gas. A flow rate of the HBr gas ranges from approximately 100 sccm to approximately 300 sccm, and a flow rate of the $Cl_2$ gas ranges from approximately 10 sccm to approximately 50 sccm. If the etching process is performed using the gas mixture having the above mentioned flow rate, the etch rate of the hard mask pattern 23A including polysilicon is approximately 2 to 3 times faster than that of tungsten. As a result, the second tungsten plug 26B can have the protrusion-shape.

The $Cl_2$ gas mainly induces a chemical etch of tungsten. The edges of the upper sidewalls of the second tungsten plug 26B can be inclined due to the $Cl_2$ gas.

The hard mask pattern 23A can also include a metal layer. If the hard mask pattern 23A includes a metal layer, the etching process can be performed using a gas mixture of trichloroborane ($BCl_3$), $Cl_2$, and $SF_6$.

As described above, after the hard mask pattern 23A is removed, the surface of the second tungsten plug 26B is positioned higher than the surface of the patterned insulation layer 22A. The second tungsten plug 26B protrudes above the contact hole 25. Accordingly, particles and pollutants generated during a subsequent process cannot flow into the contact hole 25.

The second tungsten plug 26B has the top surface, and the edges of the upper sidewalls exposed over an upper portion of the contact hole 25. In contrast, the tungsten plug of the convention type only exposes the top surface of the plug.

Figure 3F:
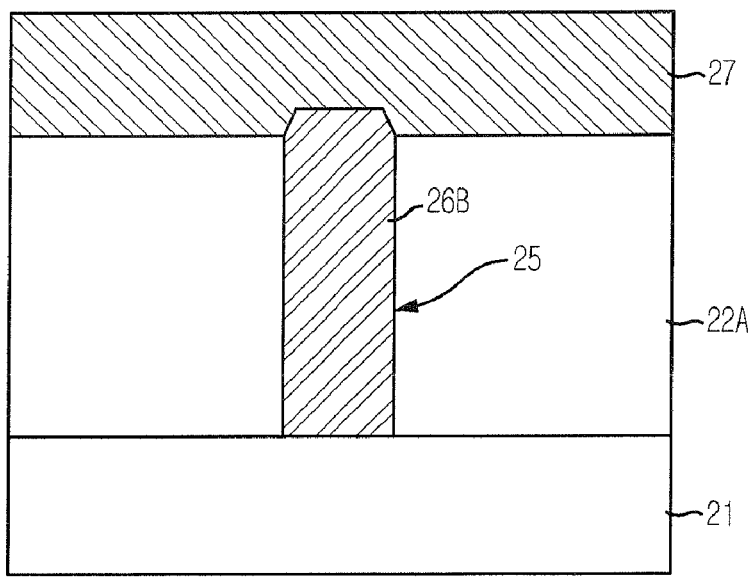

As shown in FIG. 3F, a metal layer is formed over the second tungsten plug 26B and then patterned to form a metal line 27. The metal layer used to form the metal line 27 includes aluminum. In addition to aluminum, the metal layer can also include copper and tungsten.

According to the present embodiment, the top surface of the second tungsten plug 26B protrudes, and thus the contact area between the metal line 27 and the second tungsten plug 26B can be increased. The pathway transferring electric signals can be widened; resistance can be decreased; and particles and pollutants cannot flow into the contact hole. Accordingly, the metal line 27 and the second tungsten plug 26B can have good electrical contact.

The embodiment of the present invention can be applied to other methods for forming plugs in semiconductor devices which use an etch back process including an over etch. Also, the embodiment of the present invention is not limited to tungsten plugs and may be applied to plugs including other materials, e.g., polysilicon, aluminum, or copper.

According to the present embodiment, the second tungsten plug protrudes by controlling etch selectivity between the hard mask pattern and the second tungsten plug, thereby providing an effect in increasing a contact area between the metal line and the second tungsten plug.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming an insulation layer over a substrate;
    etching the insulation layer using a hard mask pattern to form a contact hole, wherein a portion of the hard mask pattern is removed during the etching of the insulation layer such that a remainder of the hard mask pattern remains over the insulation layer, the hard mask pattern comprising a nitride-based layer;
    filling the contact hole with a conductive layer;
    performing an etch-back process on the conductive layer to form a plug in the contact hole, wherein an upper surface of the plug is positioned higher than an interface between the remainder of the hard mask pattern and the insulation layer due to the remainder of the hard mask pattern;
    removing the remainder of the hard mask pattern to expose an upper portion of the plug using an etch gas comprising a gas mixture of $C_4F_6$, $SF_6$, and $Cl_2$ such that the upper portion of the plug protrudes above the insulation layer; and
    forming a metal line over the protruding plug and around the upper portion of the plug.

2. The method of claim 1, wherein the removing of the remainder of the hard mask pattern comprises using an etch selectivity allowing etching of the hard mask pattern to be faster than the plug.

3. The method of claim 2, wherein the hard mask pattern is etched approximately 2 to 3 times faster than the plug.

4. The method of claim 1, wherein a flow rate of the $C_4F_6$ gas rages from approximately 20 sccm to approximately 80 sccm, a flow rate of the $SF_6$ gas ranges from approximately 10 sccm to approximately 20 sccm, and a flow rate of the $Cl_2$ gas ranges from approximately 50 sccm to approximately 150 sccm.

5. The method of claim 1, wherein the performing of the etch-back process on the conductive layer to form the plug comprises performing a main etch process to remove the conductive layer residing above the remainder of the hard mask pattern and an over etching process to provide the upper surface of the plug to be lower than an upper surface of the remainder of the hard mask pattern.

6. The method of claim 5, wherein the conductive layer includes a tungsten layer, and the over etching process etches the tungsten layer to a certain thickness approximately 30% more than the etch target thickness of the tungsten layer.

7. The method of claim 1, wherein the remainder of the hard mask pattern has a thickness of approximately 200 Å or more.

8. The method of claim 1, wherein the conductive layer is etched to have an upper surface that is provided below an upper surface of the remainder of the hard mask pattern.

9. The method of claim 1, wherein the upper portion of the plug exposed by the removal of the remainder of the hard mask pattern has a height of at least 200 Å.

10. The method of claim 9, wherein the upper portion of the plug exposed by the removal of the remainder of the hard mask pattern has a height of no more than 500 Å.

11. The method of claim 1, wherein the metal line surrounds sidewalls of the upper portion of the plug, the sidewalls having a height of at least 200 Å.

12. The method of claim 1, wherein the plug includes tungsten, aluminum, copper, or a combination thereof 13. A method for fabricating a semiconductor device, the method comprising:
    forming an insulation layer over a substrate;
    etching the insulation layer using a hard mask pattern to form a contact hole, wherein a portion of the hard mask pattern is removed during the etching of the insulation layer such that a remainder of the hard mask pattern remains over the insulation layer, the hard mask pattern comprising polysilicon;
    filling the contact hole with a conductive layer;
    performing an etch-back process on the conductive layer to form a plug in the contact hole, wherein an upper surface of the plug is positioned higher than an interface between the remainder of the hard mask pattern and the insulation layer due to the remainder of the hard mask pattern;
    removing the remainder of the hard mask pattern to expose an upper portion of the plug using an etch gas comprising a gas mixture of HBr and $Cl_2$ such that the upper portion of the plug protrudes above the insulation layer; and
    forming a metal line over the protruding plug and around the upper portion of the plug.

14. The method of claim 13, wherein the removing of the remainder of the hard mask pattern comprises using an etch selectivity allowing etching of the hard mask pattern to be faster than the plug.

15. The method of claim 14, wherein the hard mask pattern is etched approximately 2 to 3 times faster than the plug.

16. The method of claim 13, wherein a flow rate of the HBr gas ranges from approximately 100 sccm to approximately 300 sccm, and a flow rate of the $Cl_2$ gas ranges from approximately 10 sccm to approximately 50 sccm.

17. The method of claim 13, wherein performing the etch-back process on the conductive layer to form the plug comprises performing a main etch process to remove the conductive layer above the remainder of the hard mask pattern and an over etching process to provide the upper surface of the plug to be lower than an upper surface of the remainder of the hard mask pattern.

18. The method of claim 13, wherein the upper portion of the plug exposed by the removal of the remainder of the hard mask pattern has a height of at least 200 Å.

19. The method of claim 18, wherein the upper portion of the plug exposed by the removal of the remainder of the hard mask pattern has a height of no more than 500 Å.

20. The method of claim 13, wherein the plug includes tungsten, aluminum, copper, or a combination thereof.

* * * * *